(12) United States Patent
Niedernostheide et al.

(10) Patent No.: US 10,580,653 B2
(45) Date of Patent: Mar. 3, 2020

(54) METHOD OF FORMING A SEMICONDUCTOR DEVICE

(71) Applicant: Infineon Technologies AG, Neubiberg (DE)

(72) Inventors: Franz-Josef Niedernostheide, Hagen am Teutoburger Wald (DE); Johannes Georg Laven, Taufkirchen (DE); Hans-Joachim Schulze, Taufkirchen (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 15/348,245

(22) Filed: Nov. 10, 2016

(65) Prior Publication Data

US 2017/0140938 A1    May 18, 2017

(30) Foreign Application Priority Data

Nov. 13, 2015 (DE) .................. 10 2015 119 648

(51) Int. Cl.
| | |
|---|---|
| *H01L 21/263* | (2006.01) |
| *H01L 21/28* | (2006.01) |
| *H01L 21/265* | (2006.01) |
| *H01L 21/266* | (2006.01) |
| *H01L 21/324* | (2006.01) |

(52) U.S. Cl.
CPC ........ *H01L 21/2652* (2013.01); *H01L 21/263* (2013.01); *H01L 21/266* (2013.01); *H01L 21/26513* (2013.01); *H01L 21/26586* (2013.01); *H01L 21/324* (2013.01)

(58) Field of Classification Search
CPC ............ H01L 21/263; H01L 21/26506; H01L 21/324; H01L 29/32; H01L 29/7395; H01L 21/26513; H01L 29/66333; H01L 29/36; H01L 29/7397; H01L 29/1095
See application file for complete search history.

(56) References Cited

U.S. PATENT DOCUMENTS

| | | | | |
|---|---|---|---|---|
| 3,830,668 A | * | 8/1974 | Dearnaley | H01L 21/00 257/617 |
| 4,004,950 A | * | 1/1977 | Baruch | H01L 21/22 257/104 |
| 7,491,629 B2 | * | 2/2009 | Schulze | H01L 21/223 257/E21.145 |
| 7,675,108 B2 | * | 3/2010 | Schulze | H01L 21/263 257/328 |
| 8,587,025 B1 | * | 11/2013 | Schulze | H01L 29/7393 257/139 |
| 9,054,035 B2 | * | 6/2015 | Schulze | H01L 21/26513 |
| 9,496,351 B2 | * | 11/2016 | Laven | H01L 21/26506 |
| 2003/0057522 A1 | * | 3/2003 | Francis | H01L 21/221 257/566 |

(Continued)

FOREIGN PATENT DOCUMENTS

DE    10 2012 020 785 A1    4/2014

*Primary Examiner* — Bradley Smith
*Assistant Examiner* — David J Goodwin
(74) *Attorney, Agent, or Firm* — Design IP

(57) ABSTRACT

A method of forming a semiconductor device includes irradiating a semiconductor body with particles. Dopant ions are implanted into the semiconductor body such that the dopant ions are configured to be activated as donors or acceptors. Thereafter, the semiconductor body is processed thermally.

26 Claims, 5 Drawing Sheets

(56) References Cited

U.S. PATENT DOCUMENTS

| | | | |
|---|---|---|---|
| 2005/0191827 A1* | 9/2005 | Collins | H01J 37/32082 |
| | | | 438/513 |
| 2006/0073684 A1* | 4/2006 | Schulze | H01L 21/263 |
| | | | 438/514 |
| 2007/0161219 A1* | 7/2007 | Giles | H01L 21/26506 |
| | | | 438/530 |
| 2009/0224284 A1* | 9/2009 | Nemoto | H01L 21/2255 |
| | | | 257/109 |
| 2009/0298270 A1* | 12/2009 | Mauder | H01L 21/26506 |
| | | | 438/530 |
| 2012/0248576 A1* | 10/2012 | Schmidt | H01L 21/223 |
| | | | 257/607 |
| 2013/0234201 A1* | 9/2013 | Xiao | H01L 29/7393 |
| | | | 257/139 |
| 2014/0151858 A1 | 6/2014 | Schulze et al. | |
| 2014/0302621 A1* | 10/2014 | Niimura | H01L 21/263 |
| | | | 438/14 |
| 2015/0011080 A1 | 1/2015 | Agraffeil | |
| 2016/0372541 A1* | 12/2016 | Onozawa | H01L 29/0619 |

* cited by examiner

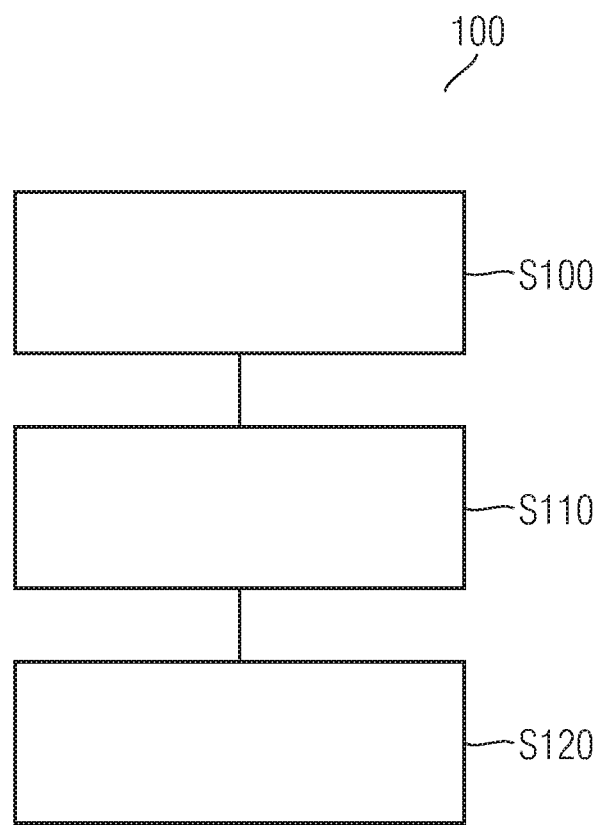

METHOD OF FORMING A SEMICONDUCTOR DEVICE

FIELD

The present disclosure relates generally to a semiconductor device and to methods for manufacturing the same.

BACKGROUND

Semiconductor doping processes are essential in front-end-of-line (FEOL) processing for manufacturing semiconductor zones of different conductivity type, for example p-doped and n-doped semiconductor zones. A precise and homogeneous doping of a semiconductor body, for example, a background doping of a semiconductor wafer, is desirable for meeting demands on specified device characteristics that may include demands on breakdown voltage, breakdown strength and softness. Meeting these demands becomes even more challenging when moving to greater ingot lengths and greater wafer diameters. Therefore, it may be desirable to improve doping precision and to reduce doping variations.

SUMMARY

The present disclosure relates to a method of forming a semiconductor device. The method comprises irradiating a semiconductor body with particles. The method further comprises implanting dopant ions into the semiconductor body, the dopant ions being configured to be activated as donors or acceptors. Thereafter, the semiconductor body is processed thermally.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1 is a schematic flow diagram for illustrating a method of manufacturing a semiconductor device according to one or more embodiments;

DETAILED DESCRIPTION

Figure 2A:
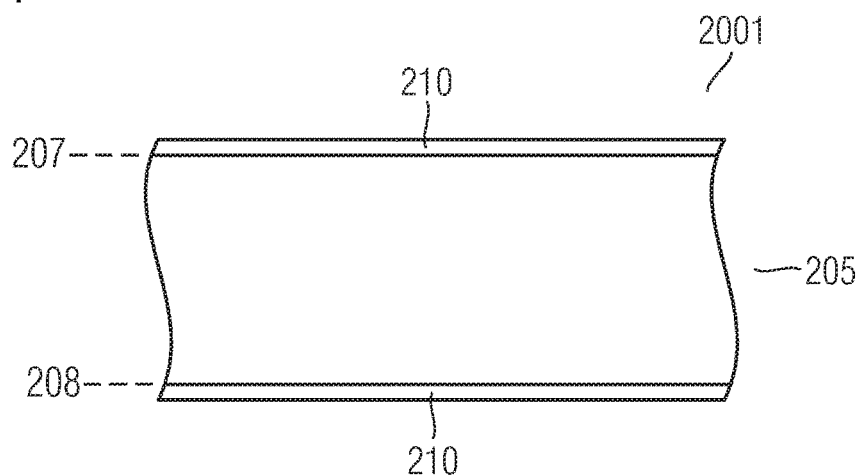
FIGS. 2A to 2D are cross-sectional views of a semiconductor body for illustrating processes of a method of manufacturing a semiconductor device according to one or more embodiments.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method may be used. Also FZ (Float-Zone) silicon wafers may be used. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, Ti and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIG. 1 is a schematic flow diagram for illustrating a method 100 of manufacturing a semiconductor device.

It will be appreciated that while method 100 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 comprises irradiating the semiconductor body with particles. Thereby, vacancies are generated in the semiconductor body by lattice disturbance caused by the irradiation.

Process feature S110 comprises implanting dopant ions into the semiconductor body, the dopant ions being configured to be activated as donors or acceptors. The donors or acceptors may be substitutional impurities replacing the host atoms of the lattice and may be different from defect related dopants such as hydrogen related donors.

Process feature S120 comprises thermal processing of the semiconductor body. Thereby, the dopants introduced by ion implantation are caused to diffuse and reallocate. The dopants may be incorporated into the lattice at the vacancies generated by the particle irradiation.

Combination of process features S100 to S120, i.e., vacancy generation by particle irradiation, implantation of dopant ions, and dopant diffusion allows for a decrease of variations of dopant concentration by setting a well-defined distribution of vacancies. By adjusting a level of vacancy concentration, for example, by appropriately setting a dose of particle irradiation, the concentration of dopant concentration may be further adjusted.

In some embodiments, thermal processing of the semiconductor body comprises heating the semiconductor body up to temperatures in a range of 500° C. and 900° C. Thermal processing may be carried out in thermal process equipment such as diffusion furnace systems, resistance based heating elements, and related components, for example. In some embodiments, thermal processing of the semiconductor body comprises heating the semiconductor body up to temperatures in a range of 600° C. to 800° C. In some embodiments, heating the semiconductor body up to the temperature ranges specified above is carried out for a duration of 30 seconds to 10 hours. In some embodiments, the semiconductor body is heated up to the temperature range specified above for a duration of 10 minutes to 5 hours. In some other embodiments, the semiconductor body is heated up to up to the temperature range specified above for a duration of 30 minutes to 3 hours. Thermal processing parameters such as temperature and/or duration may be appropriately chosen in due consideration of material properties such as a diffusion coefficient of the dopant species or a target diffusion profile to be achieved, for example.

In some embodiments, the semiconductor body is a silicon semiconductor body, and a diffusion coefficient of the donors or acceptors are equal to or greater than the diffusion coefficient of aluminum. Examples of dopants in silicon having a diffusion coefficient smaller than aluminum, for example at a temperature in a range of 1000° C. to 1200° C., are gallium (Ga), phosphorus (P), boron (B), antimony (Sb) and arsenic (As). In some embodiments, the donors or acceptors include at least one of aluminum (Al), selenium (Se) and sulfur (S). Fast-diffusing dopant species such as aluminum, selenium or sulfur in silicon allow for an efficient adjustment of dopant concentration in the semiconductor body. In other words, the dopant concentration may be adjusted based on a thermal budget attractive for FEOL process integration.

In some embodiments, the donors include selenium. An energy of selenium ion implantation may be set in a range of 30 keV to 5 MeV, or in a range of 70 keV to 500 keV, for example. A dose of selenium ion implantation may be set in a range of $2\times10^{13}$ cm$^{-2}$ to $5\times10^{14}$ cm$^{-2}$, or in a range of $3\times10^{13}$ cm$^{-2}$ to $7\times10^{13}$ cm$^{-2}$. In some other embodiments, ion implantation of selenium may be replaced by, or be supplemented by diffusion of selenium into the semiconductor body from a diffusion source, for example from a solid diffusion source such as selenium sulfide.

In some embodiments, irradiating the semiconductor body with particles comprises irradiating the semiconductor body with electrons. In some embodiments, an energy of electron irradiation is set in a range of 2 MeV to 20 MeV, or set in a range of 4 MeV to 16 MeV, or set in a range of 5 MeV to 12 MeV. In some embodiments, a dose of electron irradiation is set in a range of $10^{13}$ cm$^{-2}$ to $10^{16}$ cm$^{-2}$, or set in a range of $5\times10^{13}$ cm$^{-2}$ to $10^{15}$ cm$^{-2}$, or set in a range of $8\times10^{13}$ cm$^{-2}$ to $5\times10^{14}$ cm$^{-2}$.

In some other embodiments, irradiating the semiconductor body with particles comprises irradiating the semiconductor body with protons. An energy of proton irradiation is set in a range of 300 keV to 5 MeV or 1 MeV to 5 MeV. A dose of proton irradiation may be set in a range of $10^{13}$ cm$^{-2}$ to $8\times10^{14}$ cm$^{-2}$, or in a range of $2\times10^{14}$ cm$^{-2}$ to $8\times10^{14}$ cm$^{-2}$.

In some embodiments, particle irradiation is carried out at an angle where channeling occurs, for example at an angle equal to or smaller than 0.2° with respect to a vertical direction perpendicular to a surface of the semiconductor body.

In some embodiments, implanting dopant ions into the semiconductor body includes implanting dopant ions through a first surface into the semiconductor body and implanting dopant ions through a second surface into the semiconductor body, the second surface being opposite to the first surface. Dopant ion implantation from opposite surfaces may be beneficial to homogeneous doping along a vertical direction between the opposite surfaces. In some embodiments, the dopants ions are implanted at an angle where channeling occurs, for example at an angle equal to or smaller than 0.2° with respect to a vertical direction perpendicular to a surface of the semiconductor body.

In some embodiments, prior to irradiating the semiconductor body with particles, an oxide is formed on a surface of the semiconductor body. The oxide may be formed on a surface of the semiconductor body by a thermal oxidization process at a temperature of at least 1000° C. In some embodiments, the oxidation process is carried out at a temperature between 1100° C. and 1180° C. for a time period between two and five hours. Thereby, vacancy complexes that are present in the semiconductor body may be removed. Oxidation may be carried out in moist air or in a gaseous doping material compound comprising oxygen. Phosphorus oxytrichloride (POCl$_3$) is one example of a gaseous doping material compound comprising oxygen. Oxidation using POCl$_3$ may be followed by a process, for example an etch process for removing phosphorus-doped zones at the surface of the semiconductor body that are caused by the phosphorus in the diffusion source material.

In some embodiments, the oxide layer is used as an implantation and irradiation mask. In some other embodiments, the oxide layer is removed prior to the ion implantation and particle irradiation processes. An irradiation mask may be formed on a surface of the semiconductor body. The irradiation mask may also be patterned, for example by lithography.

In some embodiments, the semiconductor body is heated up to a temperature of at least 70° C. while irradiating the semiconductor body with particles. In some embodiments, the temperature is in a range of 120° C. to 500° C., or between 200° C. to 400° C., or between 250° C. to 350° C. Heating the semiconductor body up to the specified range allows for a reduction of the thermal budget required to distribute the implanted dopants within the semiconductor body by diffusion.

In some embodiments, the method further comprises forming a first load terminal structure and forming a second load terminal structure. In some embodiments, the semiconductor device is formed as a lateral semiconductor device comprising the first and second load terminal structures at a same surface of the semiconductor body. In some other embodiments, the semiconductor device is formed as a vertical semiconductor device comprising the first and second load terminal structures at opposite surfaces of the semiconductor body. In some embodiments, the semiconductor device is a power semiconductor diode. In some other embodiments, the semiconductor device is a power semiconductor transistor further comprising a control terminal structure, for example an insulated gate field effect transistor (IGFET) such as a metal oxide semiconductor field effect transistor (MOSFET), or an insulated gate bipolar transistor (IGBT or reverse conducting IGBT).

FIGS. 2A to 2D are cross-sectional views of a semiconductor body 205 for illustrating processes of manufacturing a semiconductor device.

Referring to the schematic cross-sectional view 2001 of FIG. 2A, opposite first and second surfaces 207, 208 of the semiconductor body 205 are oxidized thermally leading to an oxide layer 210 at the first and second surfaces 207, 208, respectively. The oxidation process may lead to a removal of undesired vacancy complexes that are present in the semiconductor body 205. The oxide layer 210 may then be removed from the first and second surfaces 207, 208, respectively, for example by an etch process. In some other embodiments, the oxide layer may remain as an irradiation and/or implantation mask and may also be patterned.

Figure 2B:
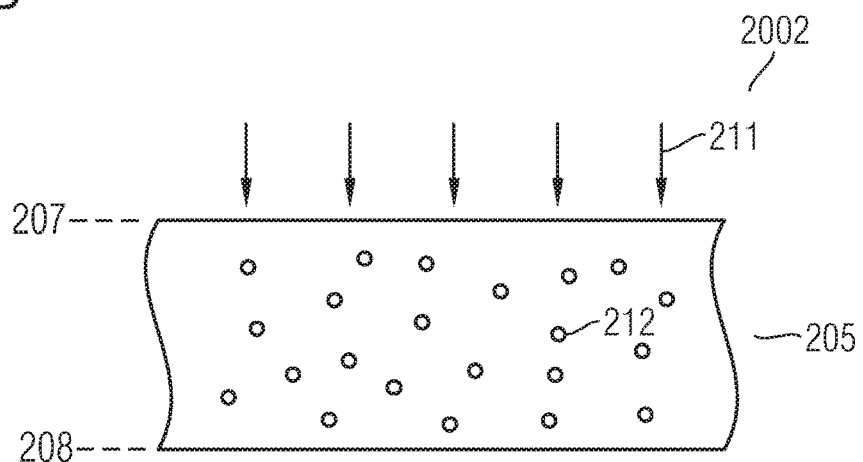

Referring to the schematic cross-sectional view 2002 of FIG. 2B, the semiconductor body 205 is irradiated with particles as described above with reference to process feature S100 in FIG. 1. Particle irradiation is illustrated by means of arrows 211. Thereby, vacancies 212 are generated in the semiconductor body 205 by lattice disturbance caused by the irradiation.

Figure 2C:
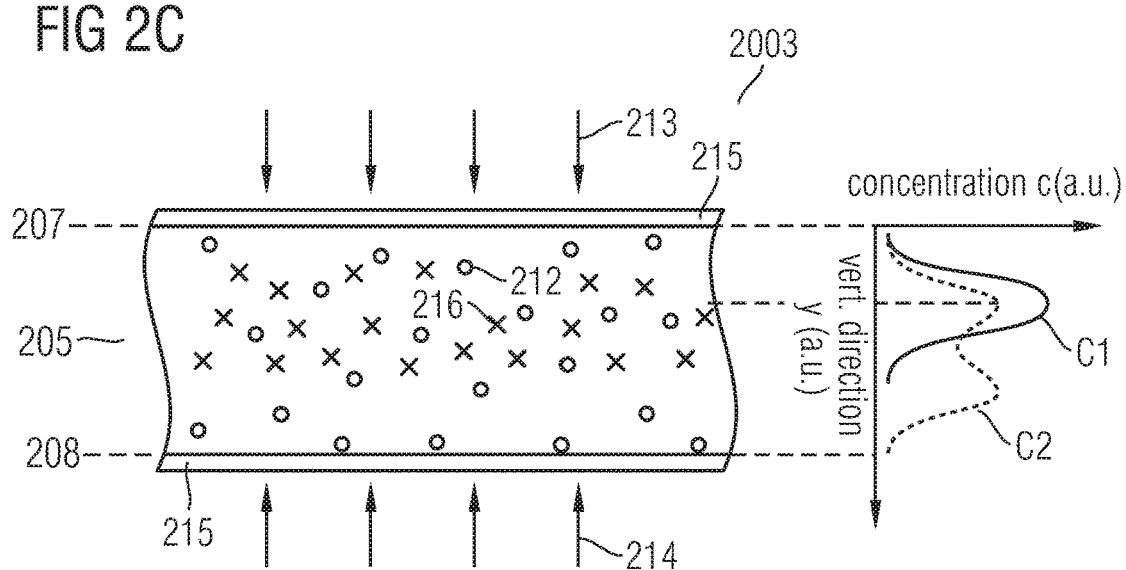

Referring to the schematic cross-sectional view 2003 of FIG. 2C, dopant ions are implanted into the semiconductor body 205 as described above with reference to process feature S110 in FIG. 1, the dopant ions being configured to be activated as donors or acceptors. Ion implantation through the first surface 207 is illustrated by means of arrows 213, and optional additional ion implantation through the second surface 208 is illustrated by means of arrows 214. An optional ion implantation mask 215 may be formed on the first and/or second surfaces 207, 208, respectively. Ion implantation results in a concentration profile c along a vertical direction y between the opposite first and second surfaces 207, 208. Curve c1 is a schematic illustration of an exemplary profile of dopants 216 related to an ion implantation process through the first surface 207. Curve c2 is a schematic illustration of an exemplary profile of dopants related to ion implantation process through the first and the second surfaces 207, 208, respectively. By adjusting ion implantation parameters such as ion implantation energy, ion implantation dose, and number of ion implantations at different ion implantation parameters, a shape of the concentration profile c may be adjusted. Particle irradiation with electrons or protons in process feature S100 in FIG. 1 may lead to a homogeneous distribution of the vacancies 212 along the vertical direction y as is illustrated in FIGS. 2B and 2C, for example.

Figure 2D:
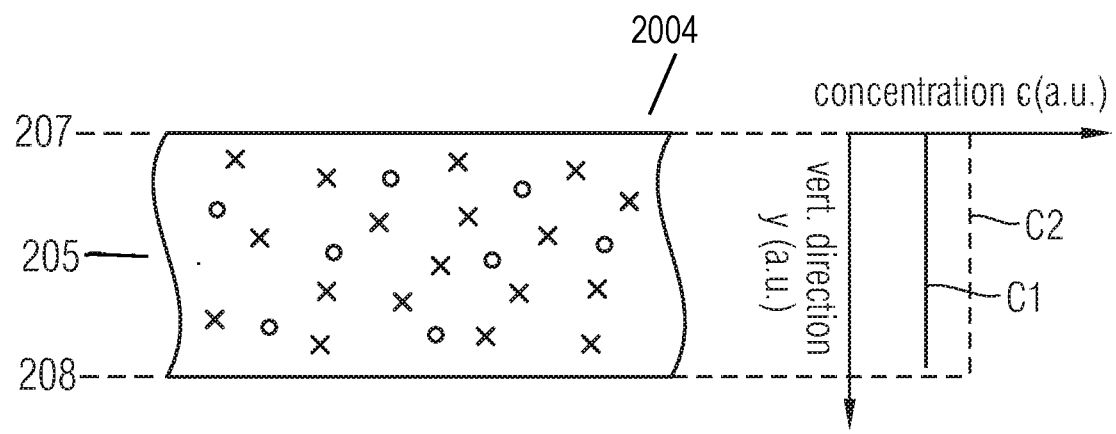

Referring to the schematic cross-sectional view 2004 of FIG. 2D, thermal processing of the semiconductor body 205 is carried out as described above with reference to the process feature S120 in FIG. 1. Thereby, the dopants introduced by ion implantation are caused to diffuse and reallocate. The dopants may be incorporated into the lattice at the vacancies generated by the particle irradiation. Reallocation may lead to a homogeneous or almost homogeneous doping concentration along the vertical direction y. If particle irradiation has a penetration depth smaller than a thickness of the semiconductor body 205 leading to a non-constant density of the vacancies 212 along the vertical direction, for example, when irradiating with protons and/or He ions, concentration profiles different from the illustration of FIG. 2D may be achieved.

In some embodiments, the process illustrated with respect to FIG. 2C may be carried out prior to the process illustrated in FIG. 2B. Particle irradiation may be carried out multiple times at different irradiation energies and/or doses, for example, proton irradiation may be carried out multiple times. Particle irradiation may also be carried out from both wafer sides, for example. Particle irradiation may also be carried out on the basis of different particle species. For example, one or more electron irradiations may be combined with one or more proton irradiations. Ion implantation may be carried out at temperatures of the semiconductor body in a range of 100° C. to 500° C., thereby combining ion implantation and reallocation of the implanted dopants by diffusion.

The method illustrated in FIGS. 1 to 2D may be used to reduce dopant concentration variations of drift or base zones of semiconductor devices such as IGBTs, FETs, diodes, thyristors, for example. The method may also be used to adjust dopant concentrations of other functional semiconductor regions, for example field stop zones. Adjustment of the dopant concentration of field stop zones may be based on end-of-range peaks of one or more proton irradiations, for example.

Figure 3A:
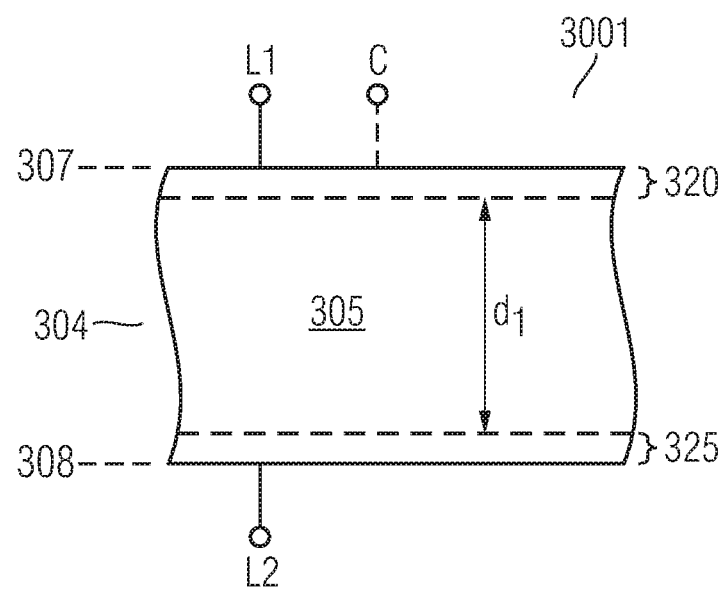
FIGS. 3A to 3D are schematic cross-sectional views of a semiconductor body for illustrating semiconductor devices manufactured by processes of FIG. 1 and FIGS. 2A to 2D according to one or more embodiments.

FIG. 3A is a schematic cross-sectional view 3001 of a portion of a vertical semiconductor device according to an embodiment. The vertical semiconductor device comprises a silicon semiconductor body 304. Doping of the silicon semiconductor body 304 includes the process features described above with reference to FIGS. 1A to 2D.

The vertical semiconductor device includes a first load terminal structure 320 at a first surface 307, e.g. front surface of the semiconductor body 304. The first load terminal structure 320 includes doped semiconductor region(s). The doped semiconductor region(s) may be formed by doping processes of the silicon semiconductor body 304 at the first surface 307, e.g. by diffusion and/or ion implantation processes. The doped semiconductor region(s) in the silicon semiconductor body 304 of the first load terminal structure 320 may include doped source and body regions of a vertical power IGFET, for example a superjunction FET or an IGBT, or an anode or cathode region of a vertical power semiconductor diode or thyristor, for example. In the course of processing the silicon semiconductor body 304 at the first surface 307, depending on the power semiconductor device to be formed in the semiconductor body, a control terminal structure such as a planar gate structure and/or a trench gate structure including gate dielectric(s) and gate electrode(s) may be formed.

The vertical semiconductor device further includes a second load terminal structure 325 at a second surface 308, e.g. a rear surface of the silicon semiconductor body 304 opposite to the first surface 307. The second load terminal structure 325 includes doped semiconductor region(s). The doped semiconductor region(s) may be formed by doping processes of the silicon semiconductor body 304 at the second surface 308, e.g. by diffusion and/or ion implantation processes. The doped semiconductor region(s) in the silicon semiconductor body 304 of the second load terminal structure 325 may include doped field stop region(s), doped drain regions of a vertical power FET, or an emitter of an IGBT, or an anode or cathode region of a vertical power semiconductor diode, for example.

A first electrical load terminal contact L1 to the first load terminal structure 320 and an electrical control terminal contact C to a control terminal structure, if present in the vertical power semiconductor device, are part(s) of a wiring area above the first surface 307. A second electrical load contact L2 to the second load terminal structure 325 is provided at the second surface 308. The electrical load contacts L1, L2 and the electrical control terminal contact C may be formed of one or a plurality of patterned conductive layers such as metallization layers electrically isolated by interlevel dielectric layer(s) sandwiched between. Contact openings in the interlevel dielectric layer(s) may be filled with conductive material(s) to provide electrical contact between the one or the plurality of patterned conductive layers and/or active area(s) in the silicon semiconductor body such as the first load terminal structure 320, for example. The patterned conductive layer(s) and interlevel dielectric layer(s) may form the wiring area above the silicon semiconductor body 304 at the first surface 307, for example. A conductive layer, e.g. a metallization layer or metallization layer stack may be provided at the second surface 308, for example.

In another embodiment, a second gate control such as a planar gate structure and/or a trench gate structure including gate dielectric(s) and gate electrode(s) may be formed at the second surface 308 (bidirectional IGBT).

In the vertical semiconductor device illustrated in FIG. 3A, a current flow direction is between the first and second load terminal contacts L1, L2 along a vertical direction between the opposite first and second surfaces 307, 308.

Figure 3B:
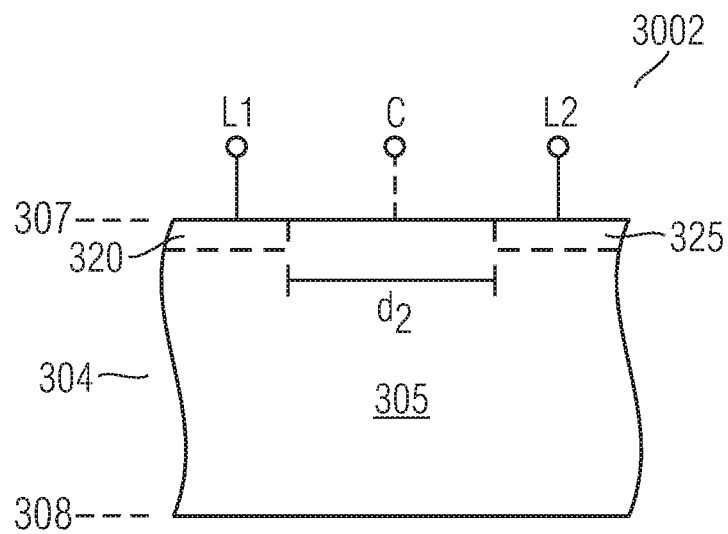

FIG. 3B is a schematic cross-sectional view 3002 of a portion of a lateral semiconductor device according to an embodiment. The lateral semiconductor device differs from the vertical semiconductor device in that the second load terminal structure 325 and the second load terminal contact L2 are formed at the first surface 307. The first and second load terminal structures 320, 325 may be formed simultaneously by same processes. Likewise, the first and second load terminal contacts L1, L2 may be formed simultaneously by same processes.

In the embodiments illustrated in FIGS. 3A and 3B, a blocking voltage capability of the vertical and lateral semiconductor devices can be adjusted by appropriate distances d1, d2 of a drift or base zone 305 between the first and second load terminal structures 320, 325, for example between a body region and a drain region of a FET. Doping of the drift zone comprises features such as doping material and doping concentration as described with respect to FIGS. 1 to 2D.

Figure 3C:
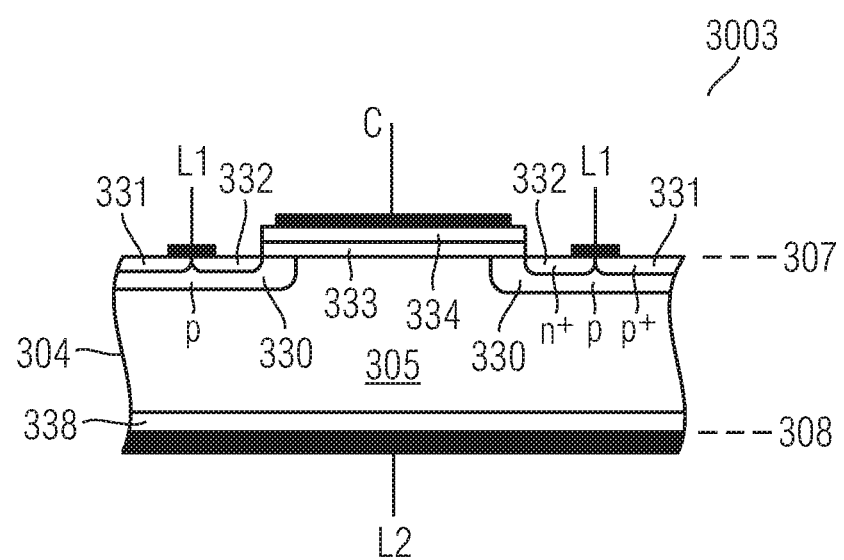

In the schematic cross-sectional view 3003 of FIG. 3C, the semiconductor device manufactured based on the processes illustrated in FIGS. 1 to 2D is a planar gate transistor comprising a p-doped body region 330, a p$^+$-doped body contact region 331 and an n$^+$-doped source region 332. A gate dielectric 333 electrically isolates a gate electrode 334 from the drift or base zone 305. The gate electrode 334 is electrically connected to the control terminal contact C. In some embodiments, the gate electrode 334 corresponds to the control terminal contact C. The first load terminal contact L1, for example an emitter terminal contact is electrically connected to the p-doped body region 330 via the p$^+$-doped region 331 and to the n$^+$-doped source region 332. A highly doped region 338, for example a p$^+$-doped bipolar injection region of an IGBT or an n$^+$-doped drain contact region of an IGFET at the second surface 308 is electrically connected to the second load terminal contact L2, for example a collector terminal contact.

Figure 3D:
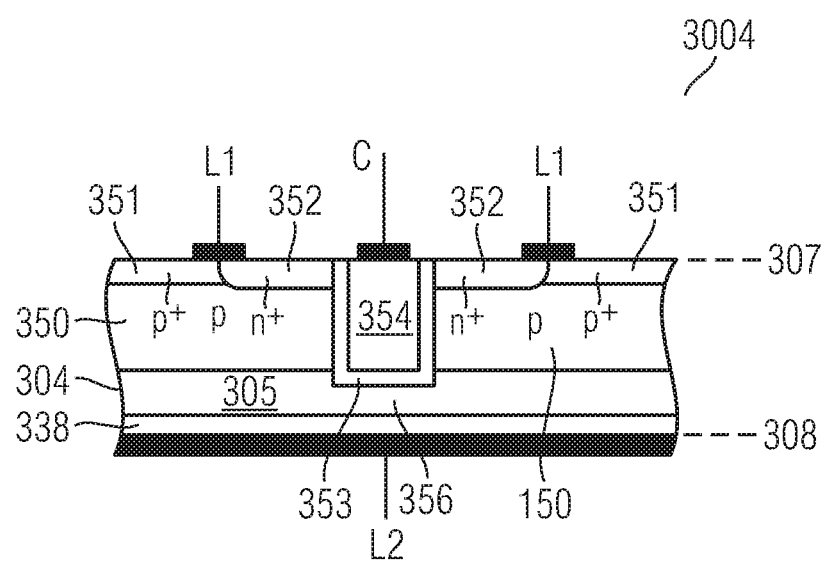

In the schematic cross-sectional view 3004 of FIG. 3D, the semiconductor device manufactured based on the processes illustrated in FIGS. 1 to 2D is a trench gate transistor comprising a p-doped body region 350, a p$^+$-doped body contact region 351 and an n$^+$-doped source region 352. A gate dielectric 353 in a trench 356 electrically isolates a gate electrode 354 from the drift or base zone 305. The gate electrode 354 is electrically connected to the control terminal contact C. In some embodiments, the gate electrode 354 corresponds to the control terminal contact C. The first load terminal contact L1, for example a source terminal contact is electrically connected to the p-doped body region 350 via the p$^+$-doped region 351 and to the n$^+$-doped source region 352. The highly doped region 338, for example a p$^+$-doped bipolar injection region of an IGBT or an n$^+$-doped drain contact region of an IGFET at the second surface 308 is electrically connected to the second load terminal contact L2, for example a collector terminal contact. In addition to the gate dielectric 353 and the gate electrode 354, one or more field dielectric(s) and field electrode(s) may be arranged in the trench 356, for example between the gate electrode 354 and a bottom side of the trench.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor device, comprising:
   irradiating a semiconductor body with particles such that vacancies are generated in the semiconductor body, wherein the vacancies are distributed substantially throughout the semiconductor body along a vertical direction of the semiconductor body according to a vacancy distribution profile;
   subsequent to irradiating the semiconductor body with the particles and generating the vacancies in the semiconductor body, implanting dopant ions into the semiconductor body, wherein the dopant ions are at least one of selenium or sulfur, wherein the dopant ions are configured to be activated as donors or acceptors, wherein implanting the dopant ions into the semiconductor body creates a non-homogenous concentration profile of the dopant ions along the vertical direction of the semiconductor body; and
   thermal processing of the semiconductor body, subsequent to irradiating the semiconductor body with the particles and subsequent to implanting the dopant ions into the semiconductor body, such that the dopant ions are reallocated into a lattice of the semiconductor body at the vacancies generated by irradiating the semiconductor body with the particles,
   wherein the vacancies of the vacancy distribution profile are more broadly and more homogenously distributed along the vertical direction of the semiconductor body than the dopant ions of the non-homogenous concentration profile, and
   wherein, during thermal processing, the dopant ions of the non-homogenous concentration profile are reallocated into the vacancies of the semiconductor body such that the dopant ions are substantially homogeneously distributed throughout the semiconductor body along the vertical direction.

2. The method of claim 1, wherein thermal processing of the semiconductor body comprises heating the semiconductor body up to temperatures in a range of 500° C. to 900° C.

3. The method of claim 2, wherein heating the semiconductor body up to temperatures in a range of 500° C. to 900° C. is carried out for a duration of 30 seconds to 10 hours.

4. The method of claim 1, wherein the semiconductor body is a silicon semiconductor body and a diffusion coefficient of the donors or the acceptors are equal to or greater than a diffusion coefficient of aluminum.

5. The method of claim 1, wherein the dopant ions include aluminum.

6. The method of claim 1, wherein the dopant ions include selenium.

7. The method of claim 6, wherein an energy of selenium ion implantation is set in a range of 30 keV to 5 MeV.

8. The method of claim 6, wherein a dose of selenium ion implantation is set in a range $2 \times 10^{13}$ cm$^{-2}$ to $5 \times 10^{14}$ cm$^{-2}$.

9. The method of claim 1, wherein irradiating the semiconductor body with the particles comprises irradiating the semiconductor body with electrons.

10. The method of claim 9, wherein an energy of electron irradiation is set in a range of 2 MeV to 20 MeV.

11. The method of claim 9, wherein a dose of electron irradiation is set in a range of $10^{13}$ cm$^{-2}$ to $10^{16}$ cm$^{-2}$.

12. The method of claim 1, wherein irradiating the semiconductor body with the particles comprises irradiating the semiconductor body with protons.

13. The method of claim 12, wherein an energy of proton irradiation is set in a range of 300 keV to 5 MeV.

14. The method of claim 12, wherein a dose of proton irradiation is set in a range of $10^{13}$ cm$^{-2}$ to $8 \times 10^{14}$ cm$^{-2}$.

15. The method of claim 1, wherein implanting the dopant ions into the semiconductor body includes implanting dopant ions through a first surface into the semiconductor body and implanting dopant ions through a second surface into the semiconductor body, the second surface being opposite to the first surface.

16. The method of claim 1, further comprising:
   prior to irradiating the semiconductor body with the particles, forming an oxide on a surface of the semiconductor body.

17. The method of claim 16, wherein forming the oxide on the surface of the semiconductor body is carried out by a thermal oxidation process at a temperature of at least 1000° C.

18. The method of claim 1, further comprising:
prior to irradiating the semiconductor body with the particles, forming an irradiation mask on a surface of the semiconductor body, the irradiation mask comprising masked and unmasked parts.

19. The method of claim 1, wherein the semiconductor body is heated to a temperature of at least 150° C. while implanting dopant ions into the semiconductor body.

20. The method of claim 1, further comprising:
forming a first load terminal structure and forming a second load terminal structure.

21. The method of claim 20, wherein at least one of the particles and the implanted dopant ions are irradiated at an angle where channeling occurs.

22. The method of claim 1, wherein the dopant ions are substitutional impurities that replace host atoms of the lattice of the semiconductor body.

23. The method of claim 1, further comprising:
removing undesired vacancy complexes from a semiconductor body prior to irradiating the semiconductor body with the particles and prior to implanting the dopant ions into the semiconductor body.

24. A method of forming a semiconductor device, comprising:
irradiating a semiconductor body with particles such that vacancies are generated in the semiconductor body, wherein the vacancies, having a vacancy distribution profile, are distributed substantially homogenously throughout the semiconductor body along a vertical direction of the semiconductor body;
implanting dopant ions into the semiconductor body, wherein the dopant ions are configured to be activated as donors or acceptors;
thermal processing of the semiconductor body, subsequent to irradiating the semiconductor body with the particles and subsequent to implanting the dopant ions into the semiconductor body, such that the dopant ions are incorporated into a lattice of the semiconductor body at the vacancies generated by irradiating the semiconductor body with the particles; and
reallocating the dopant ions into the vacancies of the semiconductor body such that the dopant ions are arranged to form a substantially homogenous concentration profile according to the vacancy distribution profile.

25. The method of claim 24, wherein the dopant ions are at least one of selenium or sulfur, and the implanting the dopant ions into the semiconductor body is subsequent to irradiating the semiconductor body with the particles and generating the vacancies in the semiconductor body.

26. A method of forming a semiconductor device, comprising:
irradiating a semiconductor body with particles a plurality of times such that vacancies are generated in the semiconductor body, wherein the vacancies are distributed substantially throughout the semiconductor body along a vertical direction of the semiconductor body according to a vacancy distribution profile that includes a plurality of concentration peaks at different depths in the semiconductor body;
implanting dopant ions into the semiconductor body, wherein the dopant ions are configured to be activated as donors or acceptors, wherein implanting the dopant ions into the semiconductor body creates a non-homogenous concentration profile of the dopant ions along the vertical direction of the semiconductor body; and
thermal processing of the semiconductor body, subsequent to irradiating the semiconductor body with the particles and subsequent to implanting the dopant ions into the semiconductor body, such that the dopant ions are reallocated into a lattice of the semiconductor body at the vacancies generated by irradiating the semiconductor body with the particles,
wherein the vacancies of the vacancy distribution profile are more broadly and more homogenously distributed along the vertical direction of the semiconductor body than the dopant ions of the non-homogenous concentration profile, and
wherein, during thermal processing, the dopant ions of the non-homogenous concentration profile are reallocated into the vacancies of the semiconductor body such that the dopant ions are substantially homogeneously distributed throughout the semiconductor body along the vertical direction.

* * * * *